United States Patent
Rephaeli et al.

(10) Patent No.: US 10,440,300 B2
(45) Date of Patent: Oct. 8, 2019

(54) NANOPHOTONIC HYPERSPECTRAL/LIGHTFIELD SUPERPIXEL IMAGER

(71) Applicant: Verily Life Sciences LLC, Mountain View, CA (US)

(72) Inventors: Eden Rephaeli, Mountain View, CA (US); Victor Marcel Acosta, Mountain View, CA (US); Andrew Homyk, Mountain View, CA (US)

(73) Assignee: Verily Life Sciences LLC, Mountain View, CA (US)

( * ) Notice: Subject to any disclaimer, the term of this patent is extended or adjusted under 35 U.S.C. 154(b) by 0 days.

(21) Appl. No.: 16/027,786

(22) Filed: Jul. 5, 2018

(65) Prior Publication Data

US 2018/0316880 A1 Nov. 1, 2018

Related U.S. Application Data

(60) Division of application No. 15/167,107, filed on May 27, 2016, now Pat. No. 10,033,948, which is a
(Continued)

(51) Int. Cl.
*H04N 5/369* (2011.01)
*G02B 1/00* (2006.01)
(Continued)

(52) U.S. Cl.
CPC ............. *H04N 5/369* (2013.01); *B82Y 20/00* (2013.01); *G02B 1/005* (2013.01); *G02B 5/1809* (2013.01);
(Continued)

(58) Field of Classification Search
CPC .. H04N 5/369; G02B 13/0085; G02B 5/1871; G02B 5/1809; G02B 27/1013;
(Continued)

(56) References Cited

U.S. PATENT DOCUMENTS

| 2009/0160965 A1 | 6/2009 | Sorek et al. |
| 2010/0118398 A1 | 5/2010 | Grau |

(Continued)

FOREIGN PATENT DOCUMENTS

| WO | 2004/027880 | 4/2004 |
| WO | 2008/002390 | 1/2008 |
| WO | 2013/026175 | 2/2013 |

OTHER PUBLICATIONS

International Preliminary Report on Patentability, International Application No. PCT/US2016/032747, dated Nov. 28, 2017.
(Continued)

*Primary Examiner* — Timothy J Henn
(74) *Attorney, Agent, or Firm* — McDonnell Boehnen Hulbert & Berghoff LLP

(57) ABSTRACT

Systems and methods are described that relate to an optical system including an image sensor optically-coupled to at least one nanophotonic element. The image sensor may include a plurality of superpixels. Each respective superpixel of the plurality of superpixels may include at least a respective first pixel and a respective second pixel. The at least one nanophotonic element may have an optical phase transfer function and may include a two-dimensional arrangement of sub-wavelength regions of a first material interspersed within a second material, the first material having a first index of refraction and the second material having a second index of refraction. The nanophotonic element is configured to direct light toward individual superpixels in the plurality of superpixels, and to direct light toward the first or second pixel in each individual superpixel based on a wavelength dependence or a polarization dependence of the optical phase transfer function.

19 Claims, 9 Drawing Sheets

Related U.S. Application Data continuation of application No. PCT/US2016/032747, filed on May 16, 2016.

(60) Provisional application No. 62/167,243, filed on May 27, 2015.

(51) Int. Cl.
  *B82Y 20/00* (2011.01)
  *G02B 27/10* (2006.01)
  *G02B 27/28* (2006.01)
  *G02B 5/18* (2006.01)
  *H01L 27/146* (2006.01)
  *G02B 13/00* (2006.01)

(52) U.S. Cl.
  CPC ....... *G02B 5/1871* (2013.01); *G02B 13/0085* (2013.01); *G02B 27/1013* (2013.01); *G02B 27/283* (2013.01); *H01L 27/14627* (2013.01); *H01L 27/14605* (2013.01); *Y10S 977/954* (2013.01)

(58) Field of Classification Search
  CPC .................. G02B 1/005; G02B 27/283; H01L 27/14627; H01L 27/14605; B82Y 20/00; Y10S 977/954
  See application file for complete search history.

(56) References Cited

U.S. PATENT DOCUMENTS

| | | |
|---|---|---|
| 2010/0301308 A1 | 12/2010 | Ahn |
| 2011/0175183 A1 | 7/2011 | Nabet et al. |
| 2011/0267487 A1 | 11/2011 | Yamagata et al. |
| 2012/0319222 A1 | 12/2012 | Ozawa et al. |
| 2012/0328240 A1 | 12/2012 | Ma et al. |
| 2013/0019461 A1 | 1/2013 | Rudmann et al. |
| 2013/0222547 A1 | 8/2013 | Van Rooyen et al. |
| 2014/0043611 A1 | 2/2014 | Narasimhan |
| 2014/0191113 A1 | 7/2014 | Atwater et al. |
| 2014/0263982 A1 | 9/2014 | Shkunov et al. |
| 2015/0090862 A1 | 4/2015 | Matsui et al. |
| 2015/0124306 A1 | 5/2015 | Bartoli et al. |
| 2015/0189200 A1 | 7/2015 | Jin et al. |
| 2015/0219806 A1* | 8/2015 | Arbabi ................ G02B 5/1828 359/573 |
| 2015/0247960 A1 | 9/2015 | Kildishev et al. |
| 2016/0142654 A1 | 5/2016 | Vaillancourt |
| 2016/0147080 A1 | 5/2016 | Son et al. |
| 2016/0173834 A1 | 6/2016 | Bert et al. |
| 2016/0259175 A1 | 9/2016 | Ellenbogen et al. |
| 2017/0127024 A1 | 5/2017 | Yokogawa |

OTHER PUBLICATIONS

Chen et al., "Nanophotonic Image Sensors", Small, 2016, 12(36), 4922-4935.

* cited by examiner

NANOPHOTONIC HYPERSPECTRAL/LIGHTFIELD SUPERPIXEL IMAGER

CROSS-REFERENCE TO RELATED APPLICATION

The present non-provisional patent application is a divisional application of U.S. patent application Ser. No. 15/167,107 filed on May 27, 2016 and claims priority to U.S. Provisional Patent Application No. 62/167,243 filed on May 27, 2015, and International Application No. PCT/US16/32747 filed May 16, 2016, the contents of each of which are hereby incorporated by reference.

BACKGROUND

Unless otherwise indicated herein, the materials described in this section are not prior art to the claims in this application and are not admitted to be prior art by inclusion in this section.

Optical components that incorporate metamaterial surfaces have been realized using numerical simulation and nanofabrication technologies. Metamaterial surfaces may include sub-wavelength arrangements of materials having different refractive indices. For instance, the sub-wavelength arrangements may include line/grating structures, split ring structures, post structures, and/or "inverse" structures, e.g. holes, trenches, etc. The "critical" dimensions of such structures (e.g. split ring gap, post diameter, etc.) may be 300 nm or less.

SUMMARY

In a first aspect, an optical system is provided. The optical system includes an image sensor and at least one nanophotonic element optically-coupled to the image sensor. The image sensor includes a plurality of superpixels. Each respective superpixel of the plurality of superpixels includes at least a respective first pixel and a respective second pixel. The at least one nanophotonic element has an optical phase transfer function and includes a two-dimensional arrangement of sub-wavelength regions of a first material interspersed within a second material, the first material having a first index of refraction and the second material having a second index of refraction. The at least one nanophotonic element is configured to direct light toward individual superpixels in the plurality of superpixels based on the optical phase transfer function. The at least one nanophotonic element is further configured to direct light toward at least one of the first pixel or second pixel in each individual superpixel based on at least one of a wavelength dependence or a polarization dependence of the optical phase transfer function.

In a second aspect, an optical system is provided. The optical system includes an image sensor and at least one nanophotonic element optically-coupled to the image sensor. The image sensor includes a plurality of superpixels. Each respective superpixel of the plurality of superpixels includes at least a respective first pixel and a respective second pixel. The at least one nanophotonic element has an optical phase transfer function and includes a two-dimensional arrangement of sub-wavelength regions of a first material interspersed within a second material, the first material having a first index of refraction and the second material having a second index of refraction. The at least one nanophotonic element is configured to direct light toward individual superpixels in the plurality of superpixels based on the optical phase transfer function. The at least one nanophotonic element is further configured to direct light toward at least one of the first pixel or second pixel in each individual superpixel based on at least one of a wavelength dependence or a polarization dependence of the optical phase transfer function. The at least one nanophotonic element is further configured to focus light along a focal plane based on the optical phase transfer function. The image sensor and the at least one nanophotonic element are configured to move with respect to one another along an optical axis over a focal distance range that includes the focal plane.

Other aspects, embodiments, and implementations will become apparent to those of ordinary skill in the art by reading the following detailed description, with reference where appropriate to the accompanying drawings.

DETAILED DESCRIPTION

Figure 1:
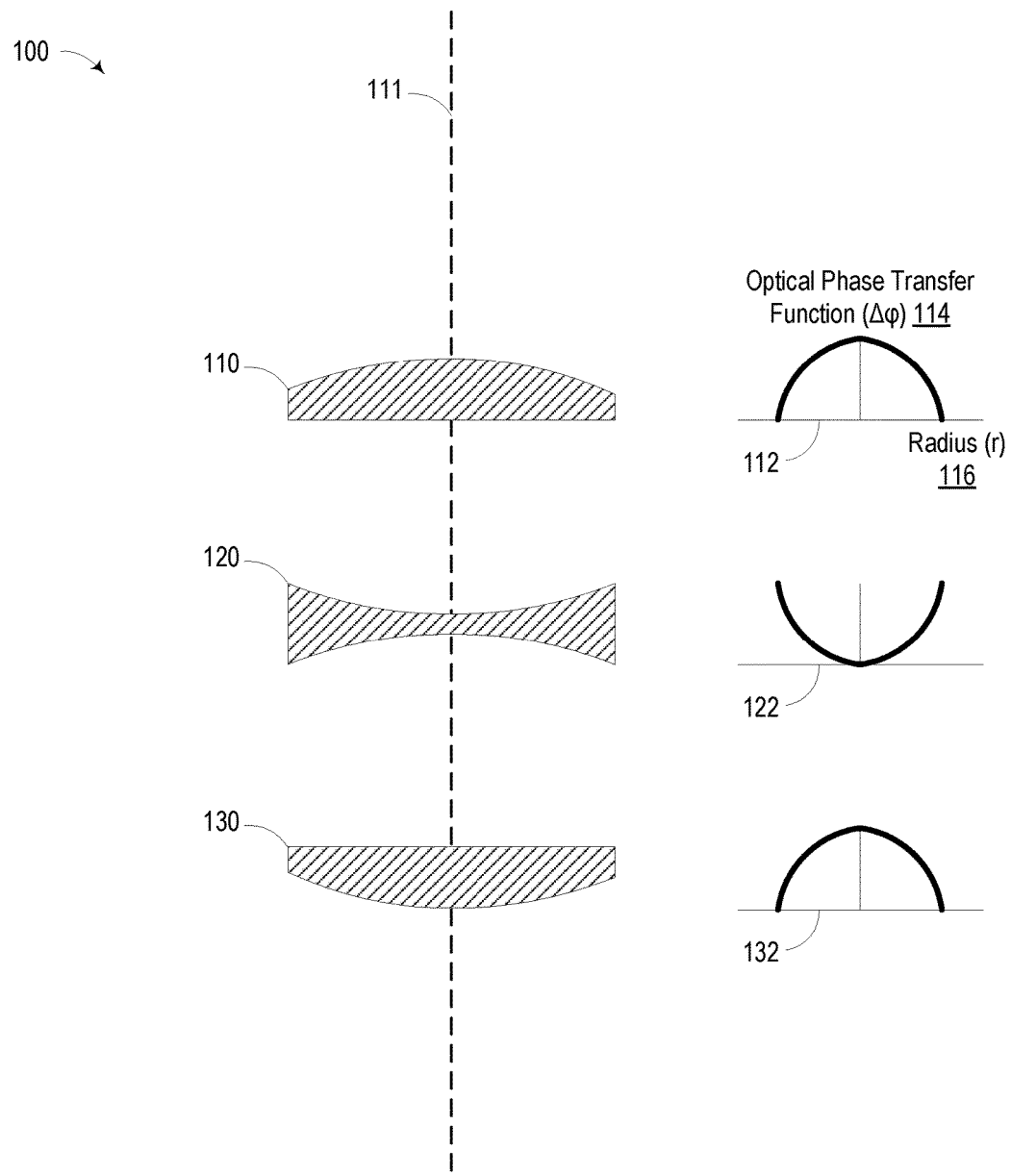
FIG. 1 is a cross-sectional schematic view of multiple refractive elements according to an example embodiment.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are contemplated herein.

Overview

Metamaterial-based optical components may exhibit characteristics similar to their refractive/reflective optic counterparts. For example, single-element gratings, mirrors, lenses, cavities, vortex beam shapers, polarizing beam splitters, 3D displays, spatial light modulators, and multichromatic lenses have been demonstrated.

Systems and methods disclosed herein describe ways to use one or more metamaterial-based, or nanophotonic, optical elements to achieve imaging with quality comparable to a conventional refractive or reflective optical system. For example, a multiple-element nanophotonic imaging system may offer superior off-axis aberration correction and high numerical aperture compared to a single-element nanophotonic element.

The nanophotonic optical system may be designed and fabricated by combining metamaterial-based optical "building blocks". The building blocks may include nanophotonic elements designed to have properties similar to a corresponding refractive/reflective imaging element group, such as a lens group.

The nanophotonic elements may include materials with varying refractive index. For instance, a first material and a second material may be arranged as a binary phase mask. In an example embodiment, a nanophotonic element may include a first material having a first refractive index (Si, $n_{Si}=4$) and a second material having a second refractive index (air, $n_{air}=1$). The first material and the second material may be interspersed in a two-dimensional arrangement of sub-wavelength regions. For example, the nanophotonic element may include a plurality of cylindrical silicon posts that protrude parallel to an optical axis of the nanophotonic element. Other shapes are possible. For example, the sub-wavelength regions may include posts with an elliptical cross-section.

The sub-wavelength regions and/or structures may include various materials. For instance, the first material (which may form, e.g. the posts) may include diamond, a metal-oxide, a III-V semiconductor, or a different material having high refractive index. Furthermore, the second material may include substances other than air. In an example embodiment, the space between posts may include a dielectric material such as SU-8 polymer, photoresist, polyimide, silicon nitride, or silicon dioxide, among other materials and/or combinations of materials.

The first material and/or the second material may be disposed in a periodic, multiperiodic, and/or an aperiodic array. For example, the plurality of posts may be arranged in a hexagonal close-packed (HCP) array. Other arrangements of the respective regions are possible. For instance, the plurality of posts may be arranged according to a square or diamond-shaped lattice.

The center-to-center distance of structures and/or sub-wavelength regions may be fixed across the nanophotonic element. Alternatively, the center-to-center post distance may vary gradually or abruptly. In yet further embodiments, a plurality of arrays, which may include similar or different periods, may be interspersed on the nanophotonic element.

The size and/or shape of the sub-wavelength regions may be fixed or may vary across the surface. For example, a nanophotonic element may include an HCP array of 200 nm tall silicon posts with nearest-neighbor spacing of 400 nm. In such a scenario, the diameter and shape of the silicon posts may vary based on a position of the respective posts within the array (e.g. along a surface of the nanophotonic element). For example, near a central optical axis of the nanophotonic element, the posts may be cylindrical with a diameter of 200 nm. However, near an outer edge of the nanophotonic element, the posts may have an elliptical cross-section with a long axis distance of 250 nm. Other arrangements, materials, sizes, shapes, and heights are possible.

Although post-like protrusions are described above, other periodic, multiperiodic, and/or aperiodic nanofabricated structures having various geometries, refractive indices, and materials are contemplated herein. For example, a sub-wavelength region of the nanophotonic element may include a plurality of split ring structures along the surface. Alternatively or additionally, a region of the nanophotonic element may include a plurality of holes, trenches, or other types of openings in the surface. Other ways of creating a nanostructured arrangement of various refractive index materials are contemplated as well.

Various arrangements of the sub-wavelength regions on the surface of the respective nanophotonic elements may enable control of the optical phase and optical polarization of light transmitted through the nanophotonic optical system. In an example embodiment, the first material and the second material may be arranged so as to control angular dependence and spectral dependence of light transmitted through the nanophotonic optical system. Additionally or alternatively, the materials may be arranged so as to provide spectral filtering of at least one wavelength or waveband. In an example embodiment, the nanophotonic optical system may selectively transmit light having wavelengths in the visible to near infrared (near-IR) wavelengths, or between 400 nanometers and 2 micrometers.

In an example embodiment, the nanophotonic optical system may be designed based on a combination of optical phase transfer functions of constituent nanophotonic elements. The optical phase transfer function of the constituent nanophotonic element may relate to the phase change of a wavefront of light transmitted through the respective nanophotonic element. For example, a nanophotonic optical system may include three optically-coupled nanophotonic elements, each having a respective optical phase transfer function. The nanophotonic elements and their respective optical phase transfer functions may be designed, selected, or combined such that a spherical aberration is corrected. Other optical aberrations may be corrected or compensated by combining a plurality of nanophotonic elements.

The nanophotonic elements may be optically coupled together so as to combine their optical phase transfer functions, overall optical transfer functions, and/or other optical characteristics. In an example embodiment, the nanophotonic elements may include a substrate handle. The substrate handle may be silicon or another material configured to provide a base for the first and second materials. A portion of the substrate may be etched or otherwise removed, so as to form a window and/or to minimize optical absorption due to the substrate. The remaining substrate may be configured to act as a physical support for the nanophotonic element. The respective substrate handles of each nanophotonic element may be "glued" or otherwise coupled together by application of a coupling material. The coupling material may be, for example, a photo-curable resin, a thermoset resin, a room temperature vulcanization (RTV) silicone, a two-part epoxy, or another type of polymer and/or adhesive material. The coupling material may be applied by a photoresist spinning process. The film thickness of the coupling material, and thus a physical distance between the nanophotonic elements, may be based at least in part on the spin speed (revolutions/sec) at which the coupling material is applied. The coupling material may be photo-cured and/or baked before and/or after coupling with adjacent nanophotonic elements.

While the above embodiments include static nanophotonic elements, dynamic scenarios are also contemplated. For example, a controller and an actuator may enable one or more nanophotonic elements to move with respect to one another. In an example embodiment, the actuator may include a piezoelectric, electrothermal, and/or electromagnetic actuator and the controller could apply an electrical signal to the actuator based on a predetermined position of, or distance between, the respective nanophotonic element(s).

Other types of actuators are possible. For example, the controller may cause one or more voice-coil motors to move the nanophotonic element(s). In an example embodiment, the controller may receive data from an angular velocity sensor. In response to determining that the data indicates a vibration or another movement that may cause an image blur or aberration, the controller may cause the voice-coil motors to move the nanophotonic element(s) so as to reduce or eliminate the effects of potential blur or aberration. In such a manner, the nanophotonic optical system could minimize and/or compensate for camera "shake" or other vibration-related effects.

Alternatively or additionally, the voice-coil motors may be configured to move the nanophotonic element(s) along the central optical axis so as to focus or defocus an image. In other words, the controller may receive data from a passive or active autofocus sensor. In response to determining that the data is indicative of a focus adjustment, the controller may cause the voice-coil motors to move the nanophotonic element(s) accordingly, e.g. to achieve proper focus of a field of view.

In an example embodiment, a curvature of a surface of at least one nanophotonic element may be configured to be finite (non-zero). In such a scenario, the optical properties of the nanophotonic element may depend on the curvature of the surface. For example, a nanophotonic element may have converging or diverging optical properties based, at least in part, on the curvature of its surface.

Furthermore, because the contemplated nanophotonic elements can be very thin (on the order of a wavelength of transmitted light), the curvature of the surface may be configured to be "curvable", bendable, or otherwise adjustable. As such, a nanophotonic element and/or a nanophotonic optical system having an adjustable curvature may enable adjustable optical power, focus, field of view, etc.

The curvature of the nanophotonic elements may be adjusted by an actuator and an associated controller. For example, the actuator may include piezoelectric material and the controller may cause at least one dimension of the material to expand and/or contract based on an electrical signal delivered to the material. Other types of actuators are possible.

Various strategies and methods may be utilized to design a nanophotonic optical system. A first technique may emulate existing refractive/reflective lens designs using nanophotonic lens elements. For example, the method may determine, for each refractive element of a refractive optical system, an optical phase transfer function or another type of optical characteristic. The optical phase transfer function may represent the change in optical properties, e.g. phase, as an optical wavefront propagates or is transmitted through the refractive/reflective lens element. After determining the optical phase transfer function for the refractive lens element, an analogous nanophotonic element may be designed based on the determined optical phase transfer function. For instance, the analogous nanophotonic elements may use structured building blocks to achieve the same, or similar, optical phase transfer profile. The unit cell of such a building block may include a plurality of high refractive index posts with varying diameter and/or position to control transmitted phase and other optical properties, e.g. polarization.

In an example embodiment, a nanophotonic optical system may be designed to be analogous to a Cooke triplet lens. A Cooke triplet lens includes a refractive lens with a negative diopter "sandwiched" between two refractive lenses with a positive diopter. In a similar fashion, the respective nanophotonic elements may be designed and fabricated to have analogous optical power to their refractive counterparts. As described above, the nanophotonic elements may include a sub-wavelength arrangement of materials with different refractive indicies. The materials may be arranged on the nanophotonic elements so as to match the optical power and/or other optical characteristics of the corresponding individual refractive lens elements of the Cooke triplet. Furthermore, the method may include optically-coupling the nanophotonic elements (e.g. arranging in a coaxial fashion) by physically gluing or otherwise coupling the rigid portions of the nanophotonic lens elements.

A second design technique may use inverse optimization to computationally solve for one or more nanophotonic elements that will achieve a threshold, or a desireable, image quality in a nanophotonic optical system. For example, the method may include determining a merit function needed to achieve a threshold image quality output from the nanophotonic optical system. The merit function may incorporate desirable values or ranges for various optical characteristics, such as: focus spot size, working distance, acceptance angle, aberration thresholds, linewidth resolution, and/or other figures of merit or transfer characteristics. In some example embodiments, the merit function may represent an optical transfer function of the nanophotonic optical system. Using finite-difference time and frequency domain (FDTD, FDFD) algorithms, the merit function may be used as one or more boundary conditions to create a threshold three-dimensional dielectric profile. The three-dimensional dielectric profile may include one or more nanophotonic elements. Similar to the above embodiments, the nanophotonic elements may be fabricated and optically-coupled to form nanophotonic optical system that exhibits the threshold image quality output.

The threshold image quality of light transmitted through the nanophotonic optical system may include an image having a predetermined diffraction-limited spatial resolution with a finite working distance. Alternatively or additionally, the threshold image quality of light may include a predetermined spatial distribution of light based on at least one of a wavelength or a polarization, e.g. a prism. Yet further, the threshold image quality of light may include predetermined correction of an optical aberration, such as a spherical aberration. In an example embodiment, the threshold image quality of light may include an image of a scene being focused to a predetermined diffraction-limited spatial resolution and the image being corrected for optical aberrations. Other threshold image quality metrics and characteristics are possible and contemplated herein.

Determining the merit function may establish certain boundary conditions, limits, formulas, and/or equations so as to realize the threshold image quality of light transmitted through the nanophotonic optical system. In an example embodiment, determining the merit function may establish a predetermined maximum spatial resolution metric and/or a predetermined maximum optical distortion metric. Other types of threshold metrics may be established when determining the merit function.

The nanophotonic optical systems described herein may enable a variety of imaging applications within the visible to near-IR wavelengths. For example, a multi-element nanophotonic optical system may provide imaging capabilities without relatively bulky refractive/reflective lens assemblies. Additionally or alternatively, a nanophotonic optical system may provide improved imaging capabilities for small-form factor cameras, e.g. smart phone camera objectives, other consumer electronic devices.

In an example embodiment, the nanophotonic optical systems described herein may be configured such that they correct for spherical and chromatic aberrations similar to microscope objectives. The nanophotonic optical systems may include a plurality of photonic elements, which may provide spectral filtering capabilities, e.g. via a dielectric thin-film Bragg stack. In an example embodiment, the spectral filtering may enable fluorescence imaging, e.g. by providing a high level of rejection of major frequencies of excitation light while allowing efficient transmission of one or more fluorescence wavelengths.

The nanophotonic elements described herein may be incorporated into optical systems configured for imaging. For example, an objective lens may focus light onto a nanophotonic element. The nanophotonic element, in turn, may be optically-coupled to an image sensor. The image sensor may include a plurality of pixels, which may be grouped and/or associated into a plurality of superpixels. In other words, each superpixel may include at least two pixels of the plurality of pixels.

The nanophotonic element may be configured to direct light towards individual superpixels according to an optical phase transfer function. The optical phase transfer function may describe how light is modified and/directed as it transits the nanophotonic element. As described above, the nanophotonic element may include a two-dimensional arrangement of sub-wavelength regions of a first material interspersed within a second material, the first material having a first index of refraction and the second material having a second index of refraction. Light passing through the at least one nanophotonic element may be directed toward at least one of the first pixel or second pixel in each individual superpixel based on at least one of a wavelength dependence or a polarization dependence of the optical phase transfer function. That is, the nanophotonic element may direct light towards different locations based on a property of the light, e.g. wavelength and/or polarization.

System Examples

FIG. 1 is a cross-sectional schematic view of multiple refractive elements 100 according to an example embodiment. The multiple refractive elements 100 may include a first refractive element 110, a second refractive element 120, and a third refractive element 130. The respective refractive elements 110, 120, and 130 may include various refractive optical materials, such as glass, polycarbonate, plastic, or other optical materials. The respective refractive elements 110, 120, and 130 may be configured to transmit light at least within the visible and near infrared (near IR) wavelength range, e.g. 400 nm to 2 μm.

In an example embodiment, a combination of the respective refractive elements 110, 120, and 130 may represent a Cooke triplet, which is a commonly-used refractive lens combination. The Cooke triplet can enable a reduction in various image aberrations, such as spherical aberrations.

The respective refractive elements 110, 120, and 130 may have respective optical phase transfer functions 114. The respective optical phase transfer functions 114 may relate to how one or more properties of light are modified upon being transmitted through the respective refractive elements 110, 120, and 130. For cylindrically or circularly-symmetric refractive elements, the optical phase transfer functions 114 may depend on a radius 116. The radius 116 may represent a distance from a central optical axis 111.

In an example embodiment, the first refractive element 110 may modify a phase of an optical wavefront 112 to a greater extent along the central optical axis 111 as compared to phase modification at the edges of the first refractive element 110. In other words, the first refractive element 110 may include a positive diopter, such as a converging lens having optical power. Furthermore, the second refractive element 120 may modify a phase of an optical wavefront 122 to a lesser extent along the central optical axis 111 as compared to phase modification at the edges of the second refractive element 120. Thus, the second refractive element 120 may include a negative diopter, such as a diverging lens having optical power.

Yet further, the third refractive element 130 may modify a phase of an optical wavefront 132 to a greater extent along the central optical axis 111 as compared to phase modification at the edges of the third refractive element 130.

FIG. 1 illustrates one of many different refractive element groupings or combinations contemplated herein. For example, contemplated refractive lens groupings may include more or fewer optical elements. Such groupings may include elements having zero optical power and/or positive or negative diopter. Furthermore, such groupings may include elements that may provide spectral and/or polarization-dependent filtering or spatial transmission (e.g. a prism).

Figure 2:
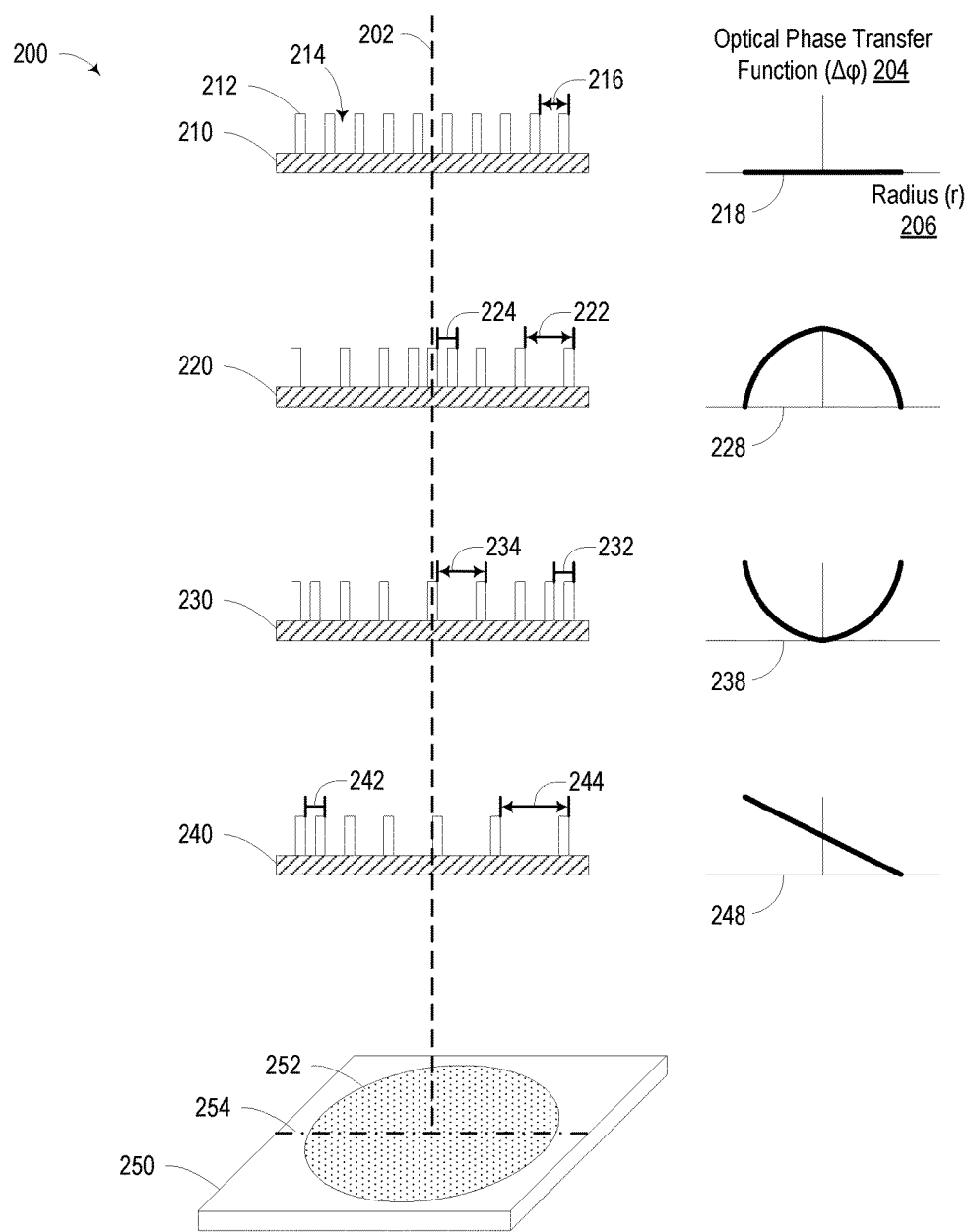
FIG. 2 is a cross-sectional schematic view of multiple nanophotonic elements according to an example embodiment.

FIG. 2 is a cross-sectional schematic view of multiple nanophotonic elements 200 according to an example embodiment. The multiple nanophotonic elements 200 may include a first nanophotonic element 210, a second nanophotonic element 220, a third nanophotonic element 230, and a fourth nanophotonic element 240.

The multiple nanophotonic elements 200 may include various arrangements of materials having different refractive indices. For example, a first nanophotonic element 210 may include a first material 212 arranged in a post-like geometry and a second material 214 that may be arranged between the posts. The first material 212 may include a metal, silicon, or another high-index material relative to the second material 214. The first material 212 may be a single material or may include a combination of constituent materials. The second material 214 may include air, silicon dioxide, or another low refractive index material relative to the first material 212. The second material 214 may include one or more constituent materials and may include a dielectric material.

Although some examples herein describe post-like structures, it will be understood that other sub-wavelength structures are possible. For example, split-ring structures, elliptical structures (e.g. post-like structures with elliptical cross-sections), and other sub-wavelength geometries are contemplated herein.

The respective nanophotonic elements 210, 220, 230, and 240 may have an optical phase transfer function 204. As described above, the optical phase transfer function 204 may relate to how one or more properties of light are modified upon being transmitted through the respective nanophotonic elements 210, 220, 230, and 240. The optical phase transfer function 204 may depend upon an arrangement of the first and second materials on the respective nanophotonic elements 210, 220, 230, and 240. In some examples described herein, the optical phase transfer function 204 may depend on a radial position 206 relative to a central optical axis 202.

Nanophotonic element 250 is an oblique angle representation of elements similar or identical to the respective nanophotonic elements 210, 220, 230, and 240. In some embodiments, a patterned area 252 may represent a metamaterial surface configured to modify one or more properties of light impinging on the metamaterial surface.

In an example embodiment, the first material 212 may be arranged in a post-like structure with a fixed period 216 along a surface of the first nanophotonic element 210. For example, the first material 212 may be arranged as posts with a fixed period 216 independent of a radial position relative a central optical axis 202. As such, an optical phase transfer function 218 may be zero and/or include a fixed phase delay for light transmitted through the first nanophotonic element 210, without regard to position.

In another embodiment, a second nanophotonic element 220 may include the post-like structures arranged such that a period decreases with decreasing radius relative to the central optical axis 202. For example, an outer radius period 222 may be larger than an inner radius period 224. Such an arrangement may provide an optical phase transfer function 228 with a relatively larger phase delay for transmitted light near the central optical axis 202 as compared to transmitted light near an outer radius of the nanophotonic element 220.

In a further embodiment, a third nanophotonic element 230 may include the post-like structures arranged such that a period increases with decreasing radius relative to the central optical axis 202. For example, an outer radius period 232 may be smaller than an inner radius period 234. Such an arrangement may provide an optical phase transfer function 238 with a relatively smaller phase delay for transmitted light near the central optical axis 202 as compared to transmitted light near an outer radius of the nanophotonic element 230.

In yet another embodiment, a fourth nanophotonic element 240 may include the post-like structures arranged such that a period increases as moving from left to right along an axis 254. For example, a left-side period 242 may be less than a right-side period 244. As such, the arrangement may provide an optical phase transfer function 248 that is greater for regions along a left-side of the axis 254 as compared to areas along a right-side of the axis 254.

Other arrangements of the post-like structures are possible. As described herein, the post-like structures may additionally or alternatively represent split-ring structures, "inverse" structures and/or hole or trench structures. Furthermore, although example embodiments that include fixed or slowly-varying periods are described above, it should be recognized that arrangements of sub-wavelength features having abruptly-changing periods, multiple periods and/or pseudo-random (aperiodic) arrangements are possible.

Figure 3:
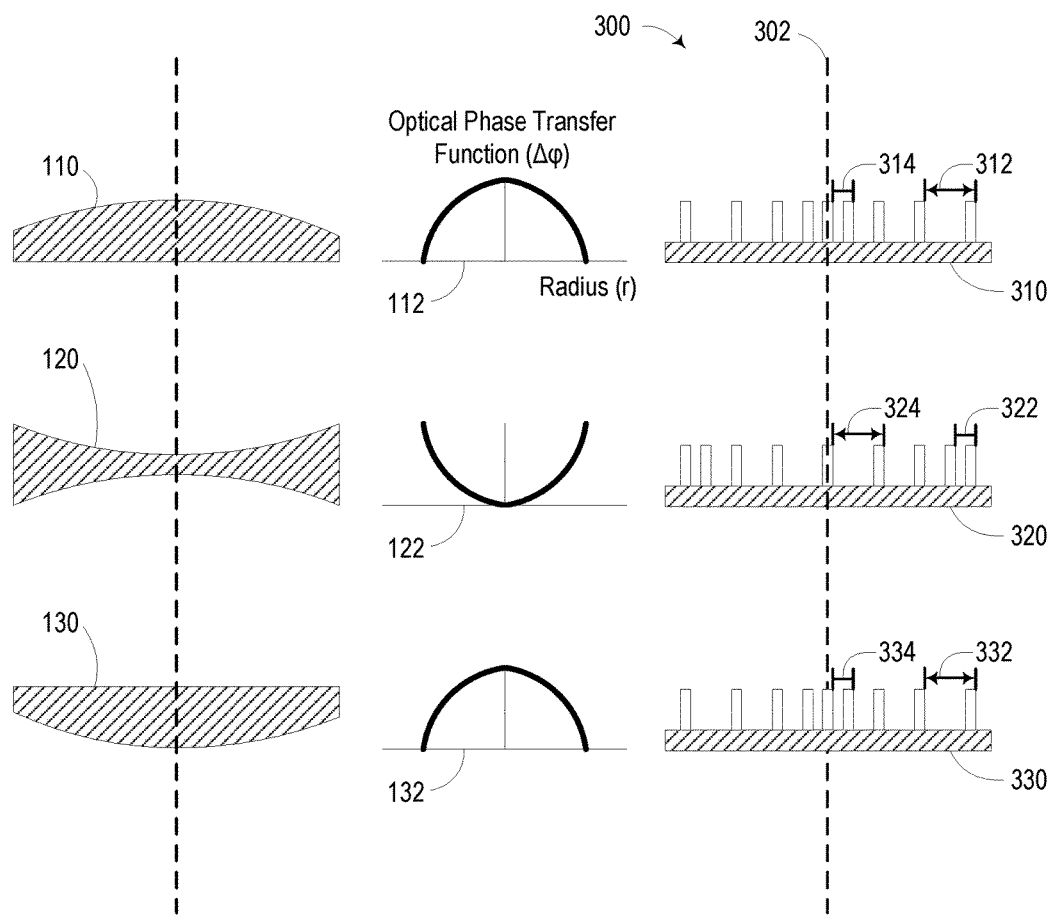
FIG. 3 is a cross-sectional schematic view of a nanophotonic optical system according to an example embodiment.

FIG. 3 is a cross-sectional schematic view of a nanophotonic optical system 300 according to an example embodiment. The multiple refractive elements may include refractive elements illustrated and described in reference to FIG. 1. The multiple nanophotonic elements may be similar or identical to the nanophotonic elements illustrated and described in reference to FIG. 2.

In an example embodiment, refractive elements 110, 120, and 130 may have respective phase transfer functions 112, 122, and 132. As described elsewhere, the refractive elements 110, 120, and 130 may be arranged in a Cooke triplet refractive lens grouping. The refractive elements 110, 120, and 130 may have respective phase transfer functions 112, 122, and 132. Namely, the refractive elements 110, 120, and 130 may have different diopters or optical powers. Furthermore, the physical arrangement and combination of the diopters of refractive elements 110, 120, and 130 may enable a reduction of various optical aberrations, such as a spherical aberration.

Nanophotonic elements 310, 320, and 330 may correspond to refractive elements 110, 120, and 130. That is, nanophotonic elements 310, 320, and 320 may be designed, fabricated, and/or otherwise configured to have optical characteristics of the respective corresponding refractive elements 110, 120, and 130. Specifically, a two-dimensional arrangement of materials having sub-wavelength dimensions and different refractive indices in the respective nanophotonic elements 310, 320, and 330 may provide similar or identical optical phase transfer functions to their refractive element counterparts.

In an example embodiment, nanophotonic elements 310 and 330 may be configured to have a positive diopter or optical power. In such a scenario, nanophotonic elements 310 and 330 may include a periodic arrangement of post structures of a first material interspersed within a second material. The periodic arrangement of posts may include a periodicity that increases with respect to an increasing radial distance from a central optical axis 302. For instance, nanophotonic elements 310 and 330 may have respective outer region periods 312 and 332, which may be larger as compared respective inner region periods 314 and 334. As such, the nanophotonic elements 310 and 330 may be configured to act as converging lenses.

Nanophotonic element 320 may be configured to have a negative diopter or optical power. In such a scenario, a periodic arrangement of posts on nanophotonic element 320 may include a periodicity that decreases with respect to an increasing radial distance from a central optical axis 302. For instance, nanophotonic element 320 may have an outer region period 322, which may be smaller as compared respective inner region period 324. As such, the nanophotonic element 320 may be configured to act as a diverging lens.

A combination of the nanophotonic elements 310, 320, and 330 may be configured to have optical characteristics similar or identical to the corresponding refractive optical system, e.g. the Cooke triplet lens group.

Figure 4A:
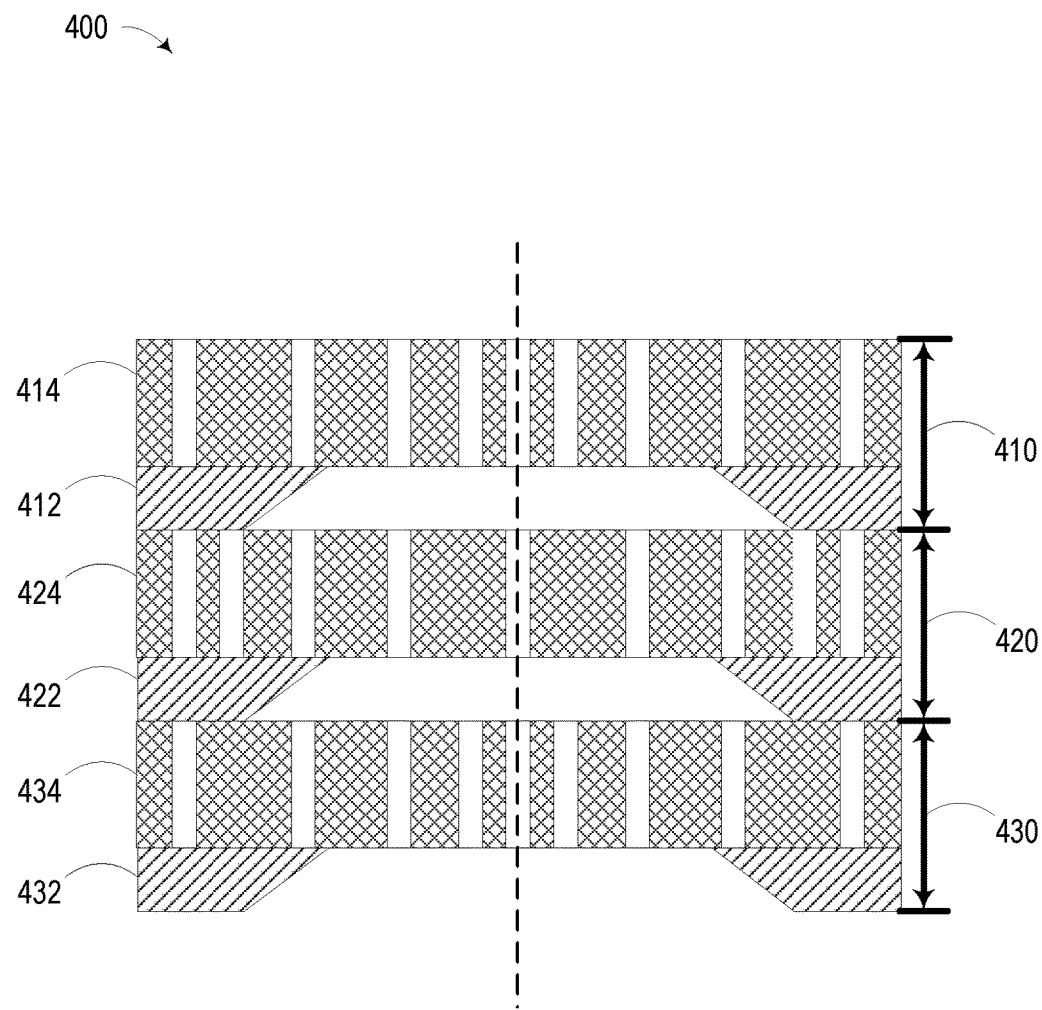
FIG. 4A is a cross-sectional schematic view of a nanophotonic optical system according to an example embodiment.

FIG. 4A is a cross-sectional schematic view of a nanophotonic optical system 400 according to an example embodiment. The nanophotonic optical system 400 may include nanophotonic elements 410, 420, and 430, which may be similar or identical to the corresponding nanophotonic elements 310, 320, and 330 as illustrated and described in reference to FIG. 3.

The nanophotonic elements 410, 420, and 430 may each include a substrate handle. The respective substrate handles 412, 422, and 432 may include silicon or a different material. The substrate handles 412, 422, and 432 may be configured to provide physical support for the materials in the nanophotonic elements 410, 420, and 430.

The substrate handles 412, 422, and 432 may be "glued" or otherwise physically-coupled via a coupling material 414 or another type of adhesive material. In some embodiments, a fixed distance between nanophotonic elements may be defined and/or maintained based on a thickness of the coupling material 414.

Alternatively, one or more of the nanophotonic elements may be mounted in a holder configured to maintain a position with respect to the other nanophotonic elements in the nanophotonic optical system.

Figure 4B:
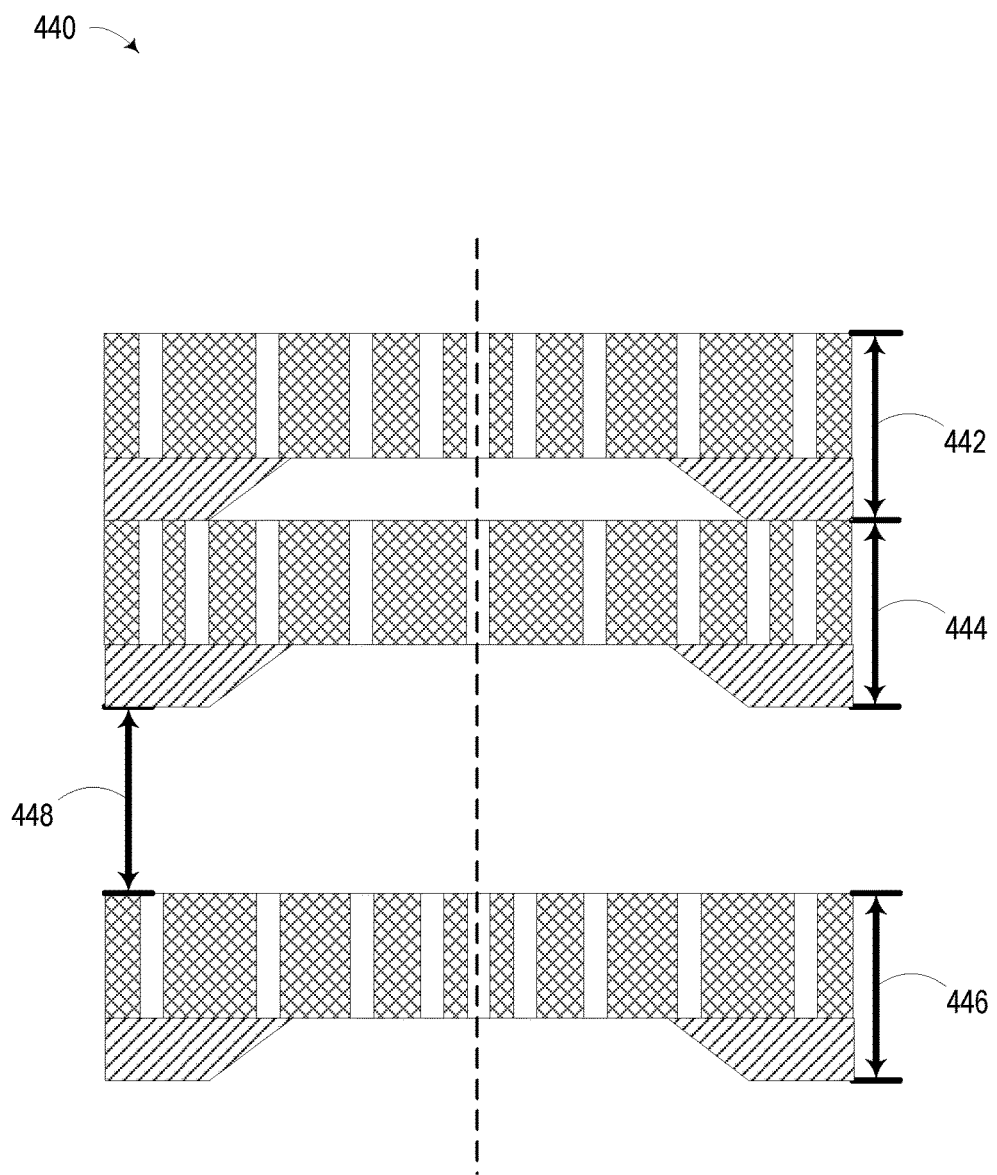
FIG. 4B is a cross-sectional schematic view of a nanophotonic optical system according to an example embodiment.

FIG. 4B is a cross-sectional schematic view of a nanophotonic optical system 440 according to an example embodiment. In the example embodiment, a first nanophotonic element 442 and a second nanophotonic element 444 may be configured to move relative to a third nanophotonic element 446. A distance 448 between the nanophotonic elements 444 and 446 may be controllably adjusted with an actuator and a controller. Such controllable adjustment may enable focusing, zooming, and/or other variations in optical characteristics of the nanophotonic optical system.

Figure 4C:
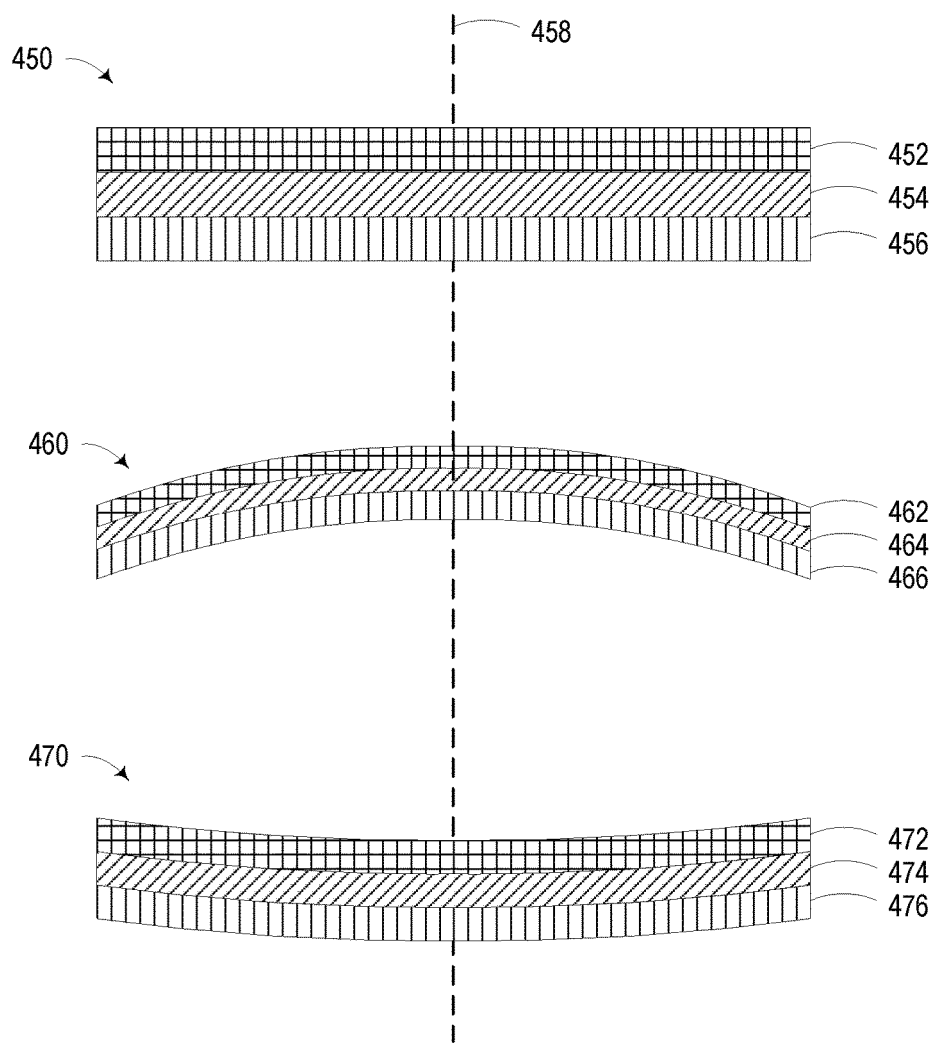
FIG. 4C is a cross-sectional schematic view of multiple nanophotonic optical systems according to an example embodiment.

FIG. 4C is a cross-sectional schematic view of nanophotonic optical systems 450, 460, and 470 according to an example embodiment. A first nanophotonic optical system 450 may include nanophotonic elements 452, 454, and 456. The first nanophotonic optical system 450 may include a curvature of zero with respect to a central optical axis 458.

A second nanophotonic optical system 460 may include nanophotonic elements 462, 464, and 466. The second nanophotonic optical system 460 may include a raised central portion such that the second nanophotonic optical system 460 has a positive curvature with respect to the central optical axis 458.

A third nanophotonic optical system 470 may include nanophotonic elements 472, 474, and 476. The second nanophotonic optical system 470 may include a raised outer portion such that the third nanophotonic optical system 470 has a negative curvature with respect to the central optical axis 458.

In an example embodiment, the overall optical power of the nanophotonic optical system may be adjusted by changing the curvature of the nanophotonic elements. For instance, in some embodiments, a negative curvature may indicate positive optical power and a positive curvature may indicate negative optical power. Adjusting the curvature of the nanophotonic optical system 460 and 470 may modify other optical characteristics of the light transiting the optical system.

Figure 5:
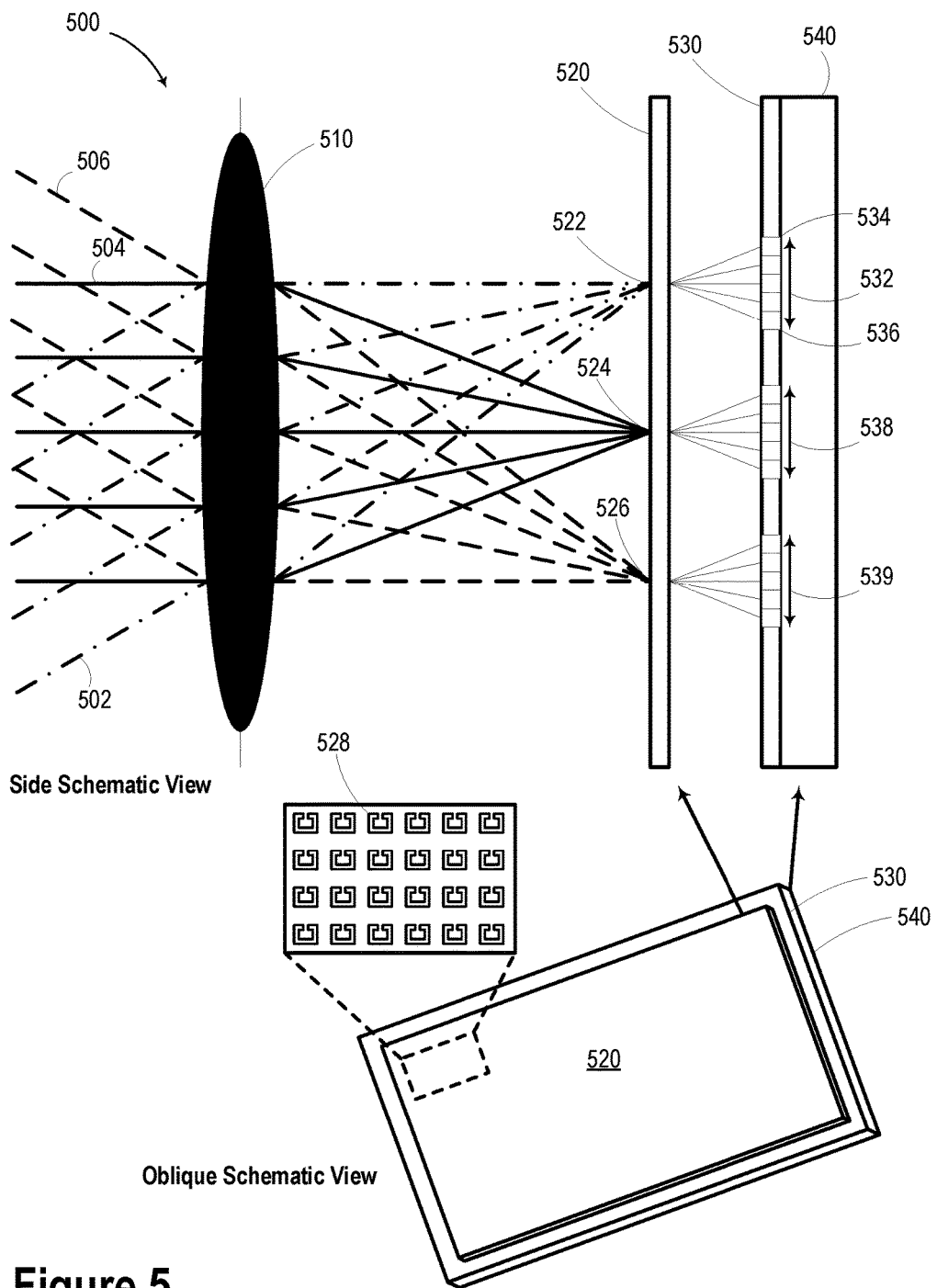
FIG. 5 is a cross-sectional and oblique schematic view of an optical system according to an example embodiment.

FIG. 5 is a cross-sectional and oblique schematic view of an optical system 500 according to an example embodiment. Optical system 500 includes an objective lens 510, at least one nanophotonic element 520, an image sensor 530, and, optionally, a read-out integrated circuit (ROIC) 540.

The objective lens 510 may include a refractive optical lens or a nanophotonic element, which may be similar to other nanophotonic elements described herein. The objective lens 510 may be configured to focus light along a focal plane based on an angle of incidence of the light. In an example embodiment, the objective lens 510 may focus light onto the nanophotonic element 520. For instance, light 502, which is incident upon the objective lens 510 at an upward angle, may be focused at focal point 522 along the nanophotonic element 520. Additionally, light 506, which is incident upon the objective lens 510 at a downward angle, may be focused at focal point 526. Furthermore, light 504, which is normally incident to the objective lens 510, may be focused at focal point 524.

The image sensor 530 may include a plurality of superpixels 532, 538, and 539. Each superpixel may include at least two pixels. For example, superpixel 532 may include a first pixel 534 and a second pixel 536. Superpixels with more constituent pixels, e.g. a 5×5 array of pixels, are considered herein.

As described above, the nanophotonic element 520 may include an optical phase transfer function and may include a two-dimensional arrangement of subwavelength regions 528 of materials with different refractive indices. Furthermore, the nanophotonic element 520 may be configured to direct light towards a respective superpixel of the plurality of superpixels. The nanophotonic element 520 may be further configured to direct light toward at least one of the first pixel 534 or a second pixel 536 in each individual superpixel based on, e.g. wavelength or polarization of the light and the optical phase transfer function.

In some embodiments, the nanophotonic element 520 may be configured to direct light having a particular characteristic towards more than one pixel in a superpixel. For example, light having a first wavelength may be directed toward a discernible pattern of pixels of a superpixel. In such an example, light having a second wavelength may be directed towards a different pattern of pixels in the superpixel. The various patterns of pixels may form an orthonormal basis such that illumination of light on a particular pattern of pixels may be mapped back to the particular characteristic, or set of characteristics (e.g. wavelength, incident angle, polarization, etc.). Put another way, light having various wavelengths (or other optical characteristics) may be directed towards multiple patterns that include one or more pixels of the superpixel. These multiple patterns may spatially overlap, at least in part. Thus, this disclosure is not limited to non-overlapping spectral-to-spatial intensity pixel patterns.

In an example embodiment, the optical phase transfer function of the at least one nanophotonic element may have a wavelength dependence. For instance, the nanophotonic element may include a two-dimensional arrangement of sub-wavelength regions configured to provide a first optical phase transfer function for the first wavelength and a second optical phase transfer function for the second wavelength. In such a scenario, the at least one nanophotonic element may be configured to direct light having a first wavelength toward the first pixel 534. Also, the at least one nanophotonic element may be configured to direct light having a second wavelength toward the second pixel 536 in each individual superpixel.

In another example embodiment, the optical phase transfer function of the at least one nanophotonic element may have a polarization dependence. For instance, the nanophotonic element may include a two-dimensional arrangement of sub-wavelength regions configured to provide a first optical phase transfer function for the first polarization and a second optical phase transfer function for the second polarization. In such a scenario, the at least one nanophotonic element may be configured to direct light having a first polarization toward the first pixel 534. Also, the at least one nanophotonic element may be configured to direct light having a second polarization toward the second pixel 536 in each individual superpixel. In other words, the at least one nanophotonic element may be configured to (i) direct light having a first polarization toward the first pixel in each individual superpixel and (ii) direct light having a second polarization toward the second pixel in each individual superpixel.

Figure 6A:
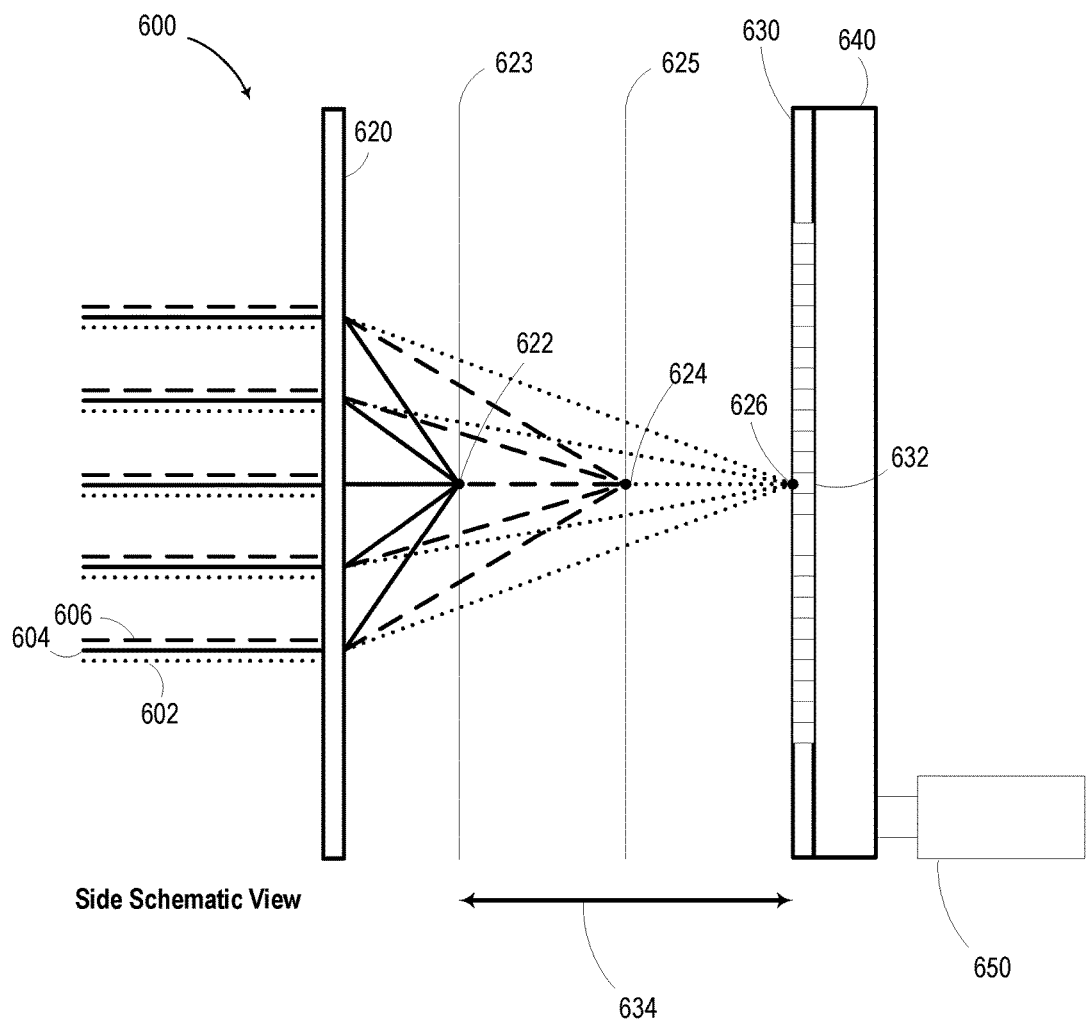
FIG. 6A is a cross-sectional view of an optical system according to an example embodiment.

FIG. 6A is a cross-sectional view of an optical system 600 according to an example embodiment. The optical system 600 includes a nanophotonic element 620, an image sensor 630, an optional ROIC 640, and an actuator 650.

The image sensor 630 may be similar or identical to the image sensor 530 illustrated and described in reference to FIG. 5. Namely, the image sensor 630 may include a plurality of pixels, which may be grouped into superpixels.

The nanophotonic element 620 may be similar or identical to the nanophotonic element 520 illustrated and described in reference to FIG. 5. That is, the nanophotonic element 620 may be optically-coupled to the image sensor 630. Furthermore, the nanophotonic element 620 may have an optical phase transfer function, which may be based on light interactions with a two-dimensional arrangement of sub-wavelength regions or structures involving materials with different indices of refraction.

In an example embodiment, the nanophotonic element 620 may be configured to direct light toward individual superpixels in the plurality of superpixels based on the optical phase transfer function. For instance, the at least one nanophotonic element may direct light toward respective superpixels based on at least one of a wavelength dependence or a polarization dependence of the optical phase transfer function. Furthermore, the at least one nanophotonic element may be further configured to focus light along a focal plane based on the optical phase transfer function.

For example, each of incident light 602, 604, and 606 may have different optical properties of a particular sort. For example, incident light 602, 604, and 606 may have different wavelengths. Alternatively or additionally, incident light 602, 604, and 606 may have different polarizations. Other optical properties are possible. The optical phase transfer function of nanophotonic element 620 may provide varying degrees of optical power based on the wavelength and/or polarization dependence of the optical phase transfer function. As a result, incident light 602, 604, and 606 may be focused along different focal planes and focal points along those focal planes. Such an optical system may be operable to create a three-dimensional "lightfield".

As an example, incident light 604 may have the smallest wavelength compared to incident light 602 and 606. The optical phase transfer function of nanophotonic element 620 may be wavelength dependent. As such, the incident light 604 may be directed toward focal point 622 along focal plane 623. Similarly, incident light 606, which may have the largest relative wavelength, may be directed toward focal point 624 along focal plane 625 and incident light 602 may be directed toward focal point 626 and pixel 632, which may lie along a focal plane corresponding with the position of image sensor 630.

In other words, a wavelength-dependent light field could be provided by the nanophotonic element 620. That is, different wavelengths of light would be directed toward (and focused) along different focal planes.

In some embodiments, the nanophotonic element 620 may be configured to direct light having a particular characteristic towards more than one pixel in a superpixel. Furthermore, the light may be directed towards more than one focal plane. In other words, light having a particular characteristic may be directed by the nanophotonic element 620 towards a three-dimensional lightfield pattern of spatial locations.

For example, light having a first wavelength may be directed toward a discernible pattern of pixels of a superpixel along a first focal plane. In such a scenario, light having a second wavelength may be directed towards a different pattern of pixels in the superpixel along a second focal plane. The various patterns of pixels may form an orthonormal basis such that illumination of light on a particular pattern of pixels and particular focal plane may be mapped back to the particular characteristic, or set of characteristics (e.g. wavelength, incident angle, polarization, etc.). Put another way, light having various wavelengths (or another optical characteristic) may be directed towards multiple patterns that include one or more pixels of the superpixel along multiple focal planes. These multiple patterns may spatially overlap, at least in part.

In an effort to image the light field, the image sensor and the at least one nanophotonic element may be configured to move with respect to one another along an optical axis over a focal distance range that includes the focal plane. In other words, image sensor 630 and ROIC 640 may be moved via actuator 650 towards or away from the nanophotonic element 620. For instance, the image sensor 630 may be controllably moved over a range of focal planes 634. In such a manner, the light field may be imaged at various wavelengths by the image sensor 630 by moving it along the optical axis in relation to the nanophotonic element 620.

Similarly, the optical phase transfer function may have a polarization dependent. In such a scenario, light having a first polarization may be directed towards a first focal plane and light having a second polarization may be directed towards a second focal plane.

Figure 6B:
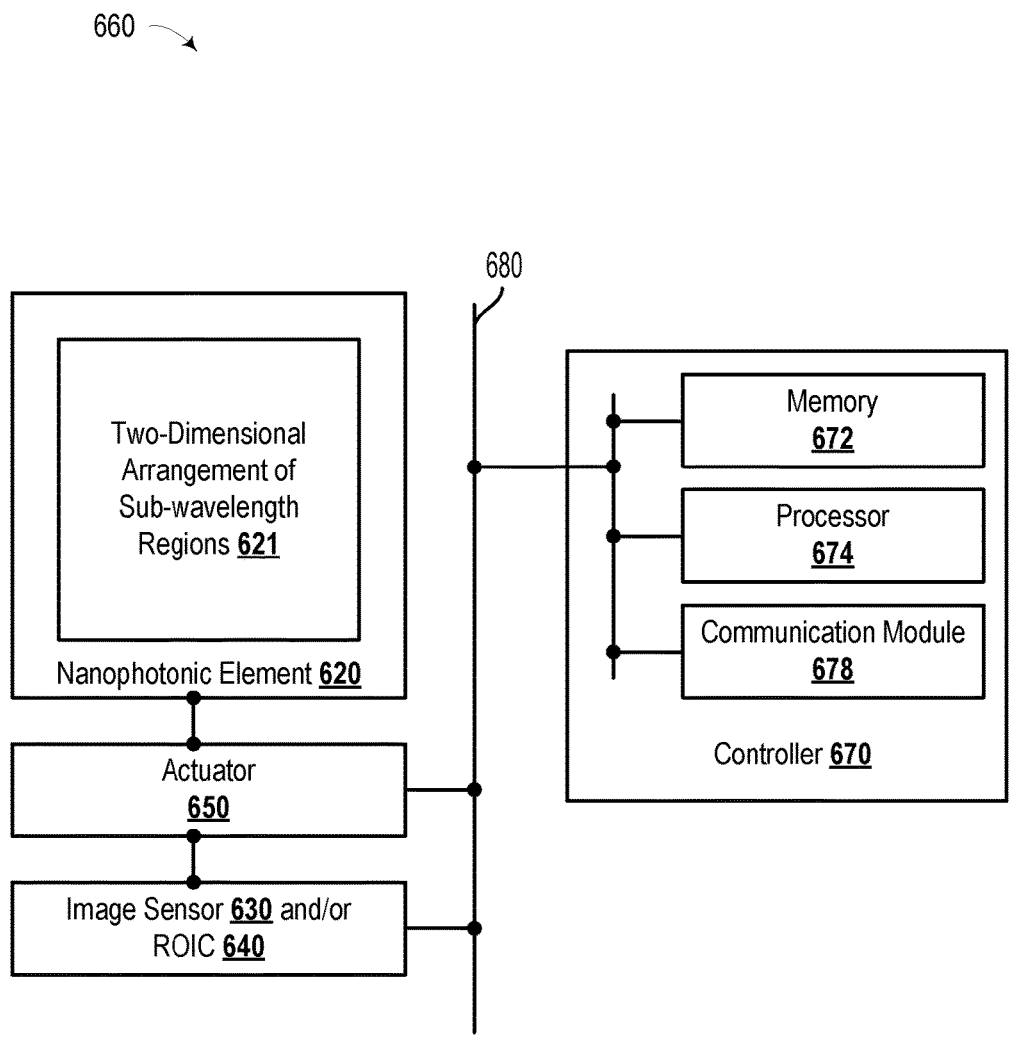
FIG. 6B is a schematic diagram of an optical system according to an example embodiment.

FIG. 6B is a schematic diagram of an optical system 660 according to an example embodiment. Optical system 660 may include a nanophotonic element 620, an actuator 650, an image sensor 630 and/or ROIC 640, and a controller 670. The optical system 660 may be similar or identical to other optical systems herein. The nanophotonic element 620 may include a two-dimensional arrangement of sub-wavelength regions 621. The controller 670 may optionally include a memory 672, a processor 674, and a communication module 678.

The controller may handle signals in an analog and/or a digital manner. In an example embodiment, the controller may include an analog control system. However, the controller may additionally or alternatively include a control system based, at least in part, on digital signal processing. Furthermore, the controller may optionally include a feedback control system. For example, the controller may receive information from multiple image sensors (or different portions of the same image sensor) as part of a phase detection process. In response to the information, the controller may perform or cause a focusing function or another type of imaging adjustment function.

In response to determining a particular focal plane, the controller 670 may cause the actuator 650 to move the nanophotonic element 620 and/or the image sensor 630 such that the image sensor 630 moves to the particular focal plane. The controller 670 may utilize a communication interface 680. The communication interface 680 may be wired or wireless.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. An optical system comprising:
   an image sensor comprising a plurality of superpixels, wherein each respective superpixel of the plurality of superpixels comprises at least a respective first pixel and a respective second pixel; and
   at least one nanophotonic element optically-coupled to the image sensor, wherein the at least one nanophotonic element has an optical phase transfer function and comprises a two-dimensional arrangement of sub-wavelength regions of a first material interspersed within a second material, the first material having a first index of refraction and the second material having a second index of refraction, wherein the at least one nanophotonic element is configured to direct light toward individual superpixels in the plurality of superpixels based on the optical phase transfer function, and wherein the at least one nanophotonic element is further configured to direct light toward at least one of the first pixel or second pixel in each individual superpixel based on at least one of a wavelength dependence or a polarization dependence of the optical phase transfer function, wherein the at least one nanophotonic element is further configured to focus light along a focal plane based on the optical phase transfer function, and wherein the image sensor and the at least one nanophotonic element are configured to move with respect to one another along an optical axis over a focal distance range that includes the focal plane, wherein the at least one nanophotonic element is further configured to provide a three-dimensional lightfield, such that different wavelengths of light are directed toward different, respective focal planes.

2. The optical system of claim 1, wherein the optical phase transfer function of the at least one nanophotonic element has a wavelength dependence, such that the at least one nanophotonic element is configured to direct light having a first wavelength toward the first pixel in each individual superpixel along a first focal plane.

3. The optical system of claim 2, wherein the at least one nanophotonic element is additionally configured to direct light having a second wavelength toward the second pixel in each individual superpixel along a second focal plane.

4. The optical system of claim 1, wherein the two-dimensional arrangement of sub-wavelength regions comprises the first material and the second material disposed so as to provide a first optical phase transfer function for the first wavelength and a second optical phase transfer function for the second wavelength.

5. The optical system of claim 1, wherein the optical phase transfer function of the at least one nanophotonic element has a polarization dependence, such that the at least one nanophotonic element is configured to (i) direct light having a first polarization toward the first pixel in each individual superpixel along a first focal plane and (ii) direct light having a second polarization toward the second pixel in each individual superpixel along a second focal plane.

6. The optical system of claim 5, wherein the two-dimensional arrangement of sub-wavelength regions comprises the first material and the second material disposed so as to provide a first optical phase transfer function for the first polarization and a second optical phase transfer function for the second polarization.

7. The optical system of claim 1, wherein the two-dimensional arrangement of sub-wavelength regions comprises at least one of: a periodic, quasi-periodic, or multi-periodic arrangement of the first material interspersed within the second material.

8. The optical system of claim 1, wherein the first material comprises at least one of: silicon (Si), diamond, a metal oxide, or a III-V semiconductor, and wherein the second material comprises air.

9. The optical system of claim 1, wherein the two-dimensional arrangement of sub-wavelength regions comprises a binary phase mask.

10. The optical system of claim 1, further comprising an actuator, wherein the actuator is coupled to at least one of the image sensor or the at least one nanophotonic element, wherein the actuator is configured to move the image sensor with respect the at least one nanophotonic element along the optical axis.

11. The optical system of claim 10, wherein the actuator comprises at least one of: a voice-coil motor, a piezoelectric actuator, an electrothermal actuator, or an electromagnetic actuator.

12. The optical system of claim 10, further comprising a controller, wherein the controller is configured to cause the actuator to move at least one of the at least one nanophotonic element or the image sensor.

13. The optical system of claim 12, further comprising an angular velocity sensor, wherein the controller is further configured to cause the actuator to move at least one of the at least one nanophotonic element or the image sensor in response to receiving movement data from the angular velocity sensor.

14. The optical system of claim 12, further comprising an autofocus sensor, wherein the controller is further configured to cause the actuator to move at least one of the at least one nanophotonic element or the image sensor in response to receiving focus adjustment data from the autofocus sensor.

15. The optical system of claim 1, wherein the at least one nanophotonic element comprises a curved surface.

16. The optical system of claim 15, wherein the at least one nanophotonic element comprises a surface with an adjustable curvature.

17. The optical system of claim 1, wherein the at least one nanophotonic element comprises a plurality of nanophotonic elements, wherein each respective nanophotonic element comprises a respective substrate handle, wherein the respective substrate handles of the plurality of nanophotonic elements are physically coupled via a coupling material, wherein a respective spacing between each respective nanophotonic element is based on a thickness of the coupling material.

18. The optical system of claim 1, wherein the sub-wavelength regions of the first material comprise at least one of: a plurality of post structures, a plurality of split ring structures, or a plurality of holes.

19. The optical system of claim 18, wherein a cross-section of at least one post structure of the plurality of post structures comprises an ellipse, wherein the cross-section is along a plane substantially parallel to the at least one nanophotonic element.

* * * * *